(12) United States Patent
Fischer et al.

(10) Patent No.: US 6,459,306 B1
(45) Date of Patent: Oct. 1, 2002

(54) LOW POWER DIFFERENTIAL COMPARATOR WITH STABLE HYSTERESIS

(75) Inventors: Jonathan Herman Fischer, Blandon, PA (US); Weilin Zhu, Allentown, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/358,558

(22) Filed: Jul. 22, 1999

(51) Int. Cl.[7] .................................................. H03K 5/22
(52) U.S. Cl. .............................. 327/67; 327/65; 327/73
(58) Field of Search ............................. 327/65, 67, 68, 327/72, 73, 74, 205, 206, 307, 362, 560, 561, 562, 563, 330, 143, 535, 540, 543

(56) References Cited

U.S. PATENT DOCUMENTS

| | | | |
|---|---|---|---|
| 4,990,799 A | * 2/1991 | Weiss | 307/355 |
| 5,155,384 A | * 10/1992 | Ruetz | 327/143 |
| 5,283,483 A | * 2/1994 | Laber et al. | 327/552 |
| 5,517,134 A | * 5/1996 | Yaklin | 327/65 |
| 5,656,957 A | * 8/1997 | Marlow et al. | 327/67 |
| 5,808,496 A | * 9/1998 | Thiel | 327/67 |
| 5,852,376 A | * 12/1998 | Kraus | 327/143 |
| 5,894,234 A | * 4/1999 | Morris | 327/65 |
| 5,912,580 A | * 6/1999 | Kimura | 327/530 |
| 6,292,031 B1 | * 9/2001 | Thompson et al. | 327/66 |

* cited by examiner

Primary Examiner—Matthew Smith
Assistant Examiner—Paul Dihn

(57) ABSTRACT

A low power differential comparator wherein the input stage bias is used not only to set a bias level but is also used to set the hysteresis level of the differential comparator circuit. The positive and/or negative inputs to the differential comparator circuit are referred to ground to reduce the total DC current draw, e.g., by a factor of 7. The multiple use of the input stage bias and grounded connections to the positive and/or negative inputs reduce the overall current requirements of the differential comparator circuit substantially while maintaining full operating speed as compared to conventional differential comparator circuits. In one embodiment using the low power differential comparator circuit, a clock receiver implements hysteresis which is relatively independent from variations in environmental factors such as temperature, and from power supply variations. In this embodiment, the input stage of a low power comparator circuit is biased by the output of a bias circuit. The bias circuit, which in the disclosed embodiment is a regulated current source, may be started-up with the output of a start-up circuit if desired. In operation, when the temperature increases the bias current decreases, but the values of hysteresis resistors in the low voltage comparator also increase. Therefore, the resultant hysteresis value does not change appreciably.

6 Claims, 5 Drawing Sheets

DIFFERENTIAL COMPARATOR CIRCUIT

LOW POWER DIFFERENTIAL COMPARATOR CIRCUIT
TOTAL SUPPLY CURRENT IS LESS THAN 48μA

LOW POWER DIFFERENTIAL COMPARATOR WITH STABLE HYSTERESIS

BACKGROUND OF THE INVENTION

1. Field of the Invention

This invention relates generally to differential comparator circuits. More particularly, it relates to an improved architecture for differential comparator circuits having lower power requirements.

2. Background of Related Art

FIG. 1 shows one type conventional differential comparator circuit having hysteresis for differential AC coupled input signals.

In particular, in FIG. 1, a differential comparator circuit includes a negative input IN, a positive input IP, a negative output ON, and a positive output OP. The negative input IN and the positive input IP are AC coupled with capacitors 104 and 106, respectively.

The bias voltage for the comparator input stage is set in part by resistors 122 and 124 setting the reference point VSG. The input hysteresis is set by feeding the comparator output signal through the resistive voltage dividers built from resistors 110, 112 and 118, 120. Resistors 114 and 116 help reduce the AC loading of the input signal at the comparator inputs while coupling the reference point VSG bias voltage and hysteresis feedback signal to the comparator inputs.

A disadvantage of a conventional differential comparator circuit having hysteresis such as the one shown in FIG. 1 is that a large DC current flow is necessary to set the hysteresis and signal reference point. For instance, in a given example, resistor 110=6K, resistor 112=88K, resistor 114=100K, resistor 116=100K, resistor 118=88K, resistor 120=6K, resistor 122=30K, and resistor 124=30K. In this example, the differential comparator circuit as shown in FIG. 1 requires a total supply current of approximately 335 microamps ($\mu$A), comprising approximately 225 $\mu$A for the differential comparator 102 and its bias circuit, plus approximately 110 $\mu$A necessary to provide the hysteresis and reference point voltage levels.

There is a need for an improved architecture for a differential comparator having hysteresis which utilizes less power than conventional comparator circuits.

SUMMARY OF THE INVENTION

In accordance with the principles of the present invention, a low power differential comparator circuit comprises a differential comparator. A positive feedback circuit is between a positive output node of the differential comparator and a positive input node to an input stage of the differential comparator. The positive feedback circuit includes a first switch. A positive feedback circuit is between a negative output node of the differential comparator and a negative input node to the input stage of the differential comparator. The positive feedback circuit includes a second switch. The first switch and the second switch operate mutually exclusively.

A method of providing hysteresis in a differential comparator comprises connecting and disconnecting positive feedback between output nodes of the differential comparator and input nodes to an input stage of the differential comparator.

A differential comparator having isolated hysteresis values in accordance with another aspect of the present invention comprises a comparator. A bias circuit biases an input stage of the comparator. The bias circuit includes at least one feedback transistor and a bias resistor. A differential output stage is connected to the comparator. Any change in a current flow through the bias resistor of the bias circuit is substantially compensated by a change in current flow through the at least one feedback transistor in the bias circuit.

A method of compensating a change in input stage bias to a differential comparator due to a variation in a power supply voltage in accordance with another aspect of the present invention comprises compensating any change in an output current from a bias resistor in a bias circuit to a differential comparator with a corresponding change in current in a feedback transistor connected to the bias resistor.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

One aspect of the present invention provides a differential comparator having hysteresis which can be used in very low power applications. The disclosed differential comparator uses, e.g., $\frac{1}{7}^{th}$ the supply current required by the exemplary conventional differential circuit shown in FIG. 1.

In accordance with this aspect of the present invention, the input stage bias sets both the input stage current and the hysteresis level of the differential comparator circuit. Moreover, in the disclosed differential comparator circuit, the positive and/or negative inputs to the differential comparator circuit are referred to ground to reduce the total DC current draw, e.g., by a factor of 7. The multiple use of the input stage bias and grounded connections to the positive and/or negative inputs reduce the overall current requirements of the differential comparator circuit substantially while maintaining full operating speed as compared to conventional differential comparator circuits.

Figure 2:
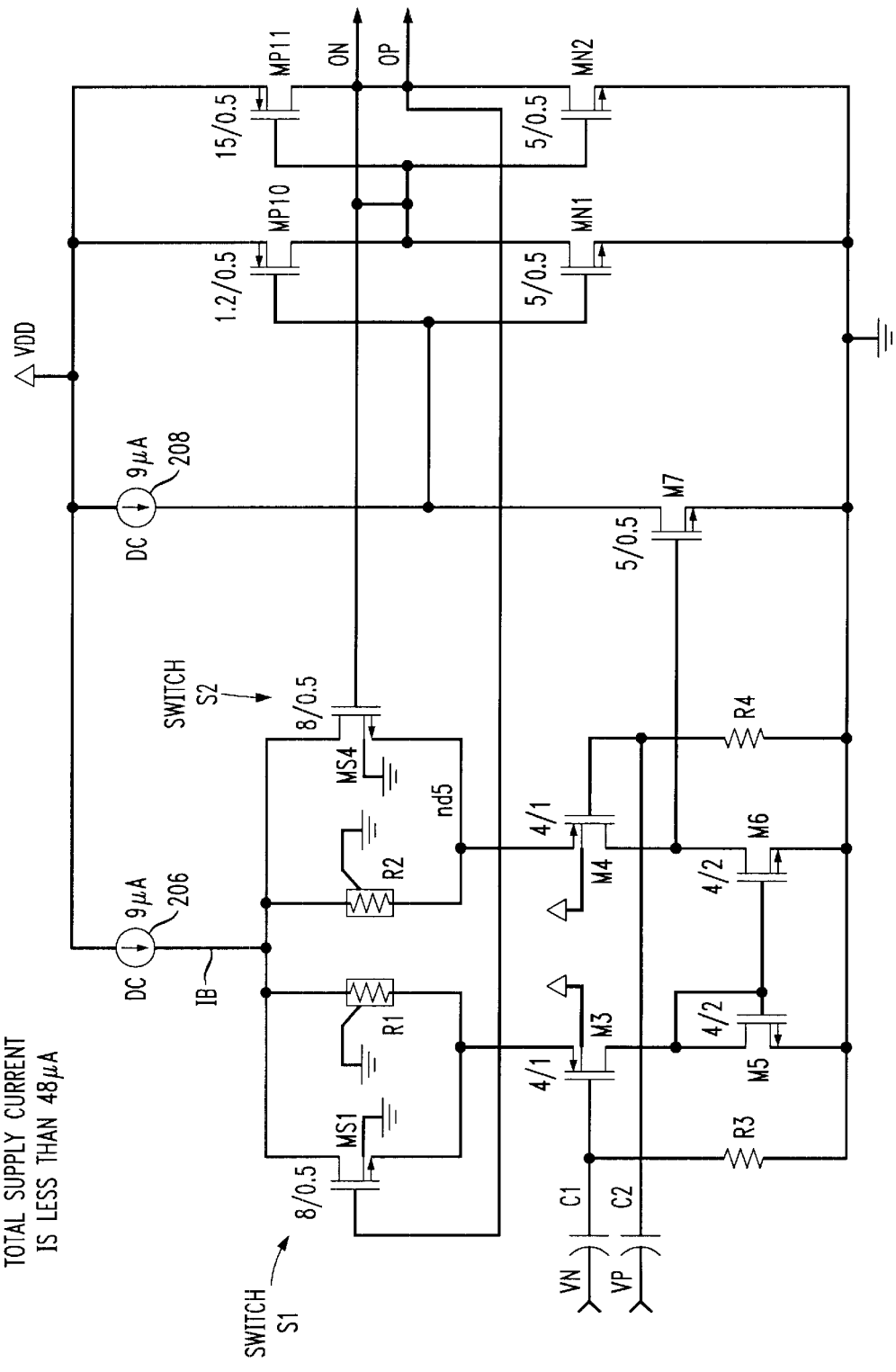
FIG. 2 shows an exemplary embodiment of a low power differential comparator having hysteresis in accordance with the principles of the present invention.

FIG. 2 shows an exemplary embodiment of a low power differential comparator having hysteresis in accordance with the principles of the present invention.

In particular, in FIG. 2, resistors R1 and R2 are added between the p-channel input transistors M3, M4 and the input stage bias current source 206.

A positive input VP is applied to a gate of an n-channel transistor M5 through an AC coupling capacitor C2, and a negative input VN is applied to a gate of a p-channel transistor M3 through an AC coupling capacitor C1. A negative differential driver is formed with complementary transistors MP10 (p-channel) and MN1 (n-channel) to provide the negative output signal ON, while a positive differential driver is formed with complementary transistors MP11 (p-channel) and MN2 (n-channel) to provide the positive output signal OP.

In the differential comparator circuit shown in FIG. 2, hysteresis is implemented by switches S1 (formed by transistor MS1) and S2 (formed by transistor MS4). The state of the switches S1 and S2 are controlled directly by the positive output signal OP and negative output signal ON, respectively. Thus, in operation, the switches S1 and S2 are mutually exclusively closed (i.e., one at a time) based on the state of the comparator outputs OP and ON.

The operation of the switches S1 and S2 switches an input referred offset of IB/2×R between the positive input VP and the negative input VIN, where R refers to the value of R1 or R2.

Accordingly, as shown in FIG. 2, the bias current IB is used to set the input hysteresis level in addition to its otherwise conventional function of biasing the input stage of the differential comparator circuit.

Figure 1:
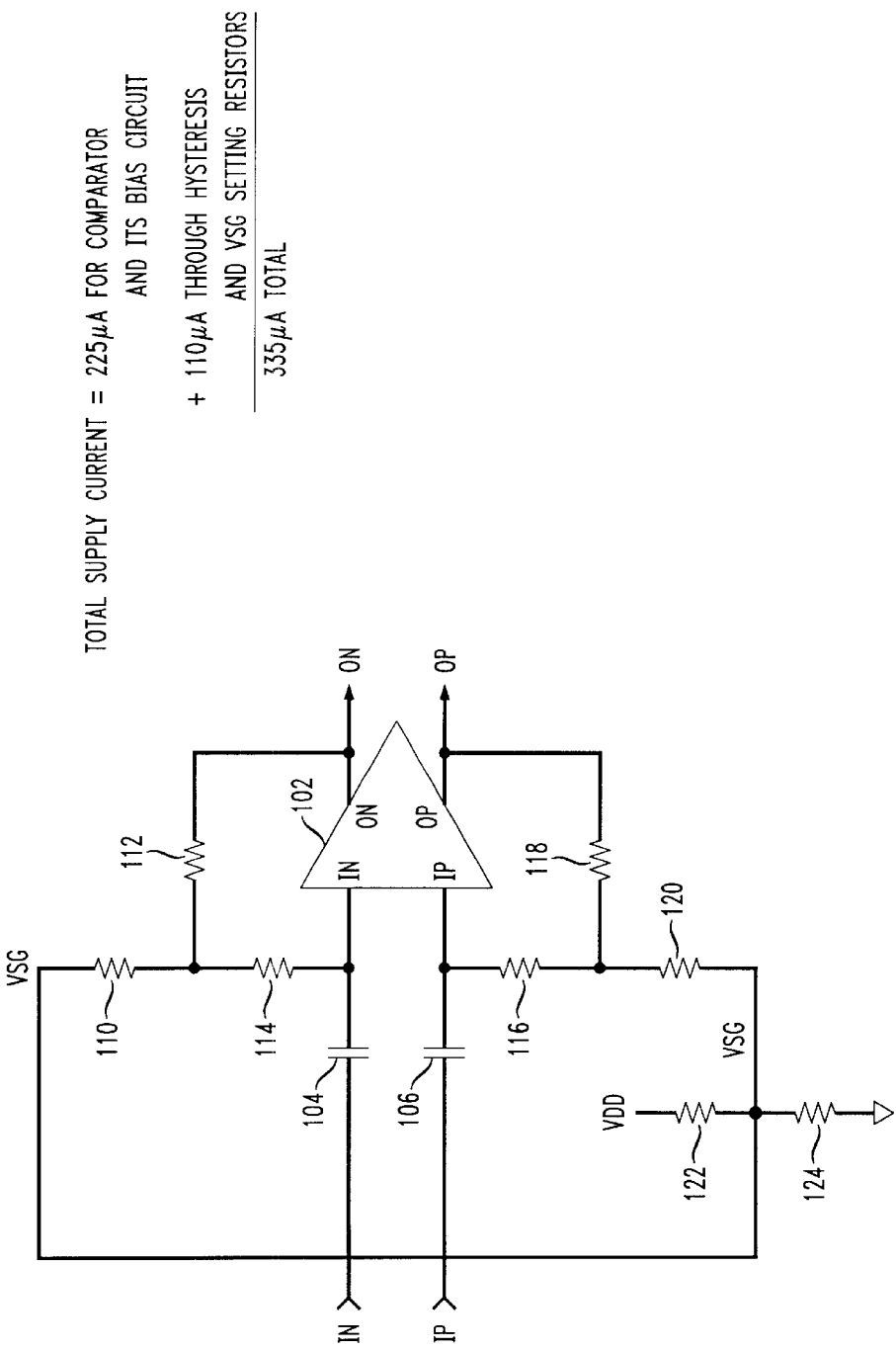
FIG. 1 shows a conventional differential comparator having hysteresis.

A second feature of this aspect of the present invention is that the resistors connected to the input nodes, i.e., R3 and R4, are connected to ground (as opposed to a mid-supply or reference bias point VSG as shown in FIG. 1).

Using p-channel inputs with their tubs tied to VDD allows the input common mode range to go down to ground. Connecting the resistors R3 and R4 to ground eliminates the excessive DC current draw required to set the mid-supply or reference bias voltage as in the conventional circuit of FIG. 1.

Thus, a differential comparator circuit in accordance with the principles of the present invention provides for a reduced supply current and fewer components than those required in conventional differential comparator circuits.

Other problems in conventional comparators having hysteresis are solved with other aspects of the present invention. Unfortunately, in conventional comparator circuits such as the one shown in FIG. 1, the amount and/or level of hysteresis changes with various environmental conditions, e.g., the level of the power supply voltage, and/or temperature.

Figure 3:
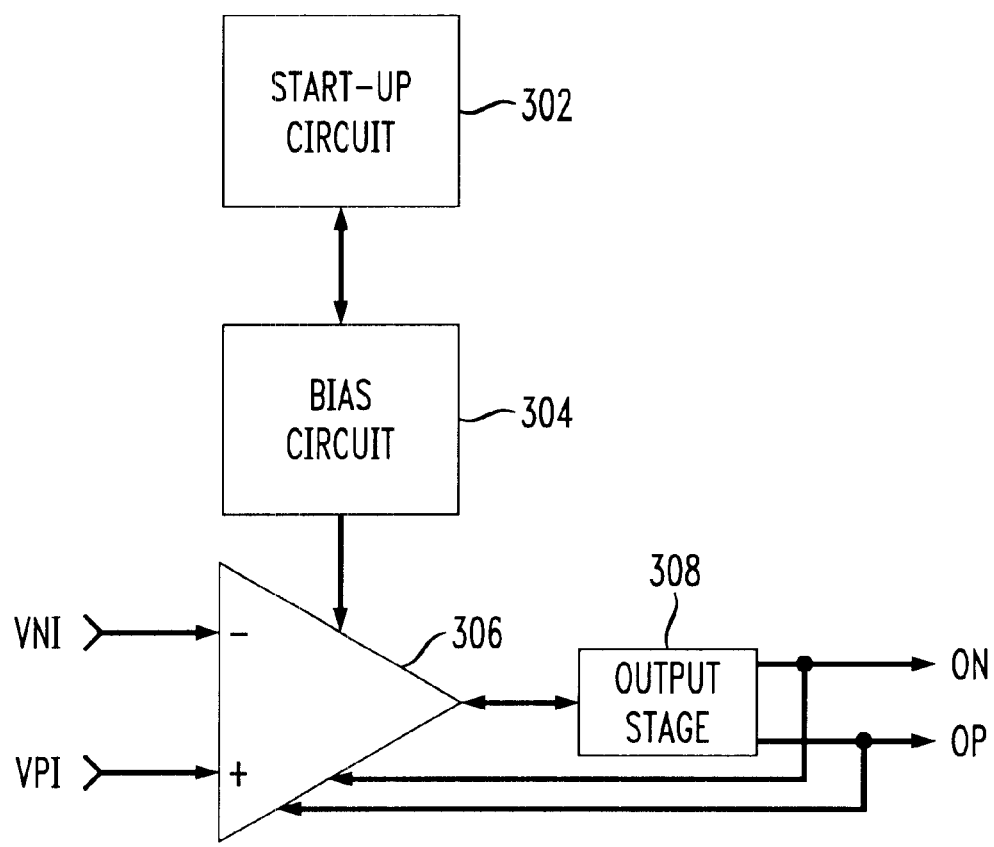
FIG. 3 shows a block diagram of an embodiment of a clock receiver circuit using a low power comparator, e.g., as shown in FIG. 2, in an architecture which compensates the amount and/or level of hysteresis from environmental factors such as temperature, and from circuit conditions such as the level of the power supply voltage, in accordance with the principles of the present invention.

FIG. 3 shows a block diagram of an embodiment of a circuit using a low power comparator, e.g., as shown in FIG. 2, in an architecture which compensates the amount and/or level of hysteresis from environmental factors such as temperature, and from circuit conditions such as the level of the power supply voltage, in accordance with the principles of the present invention.

In particular, the bias circuit in FIG. 3 compensates for environmental factors such as temperature and supply voltage to maintain an amount and/or level of hysteresis in the differential comparator, such as that shown in FIG. 2, approximately constant throughout the range of environmental changes.

In particular, FIG. 3 shows a clock receiver circuit including a differential comparator circuit formed by a comparator 306 and a differential output stage 308. The input stage of the comparator 306 is biased by the output of a bias circuit 304. The bias circuit 304 is started-up with the output of a start-up circuit 302.

Figure 4A:
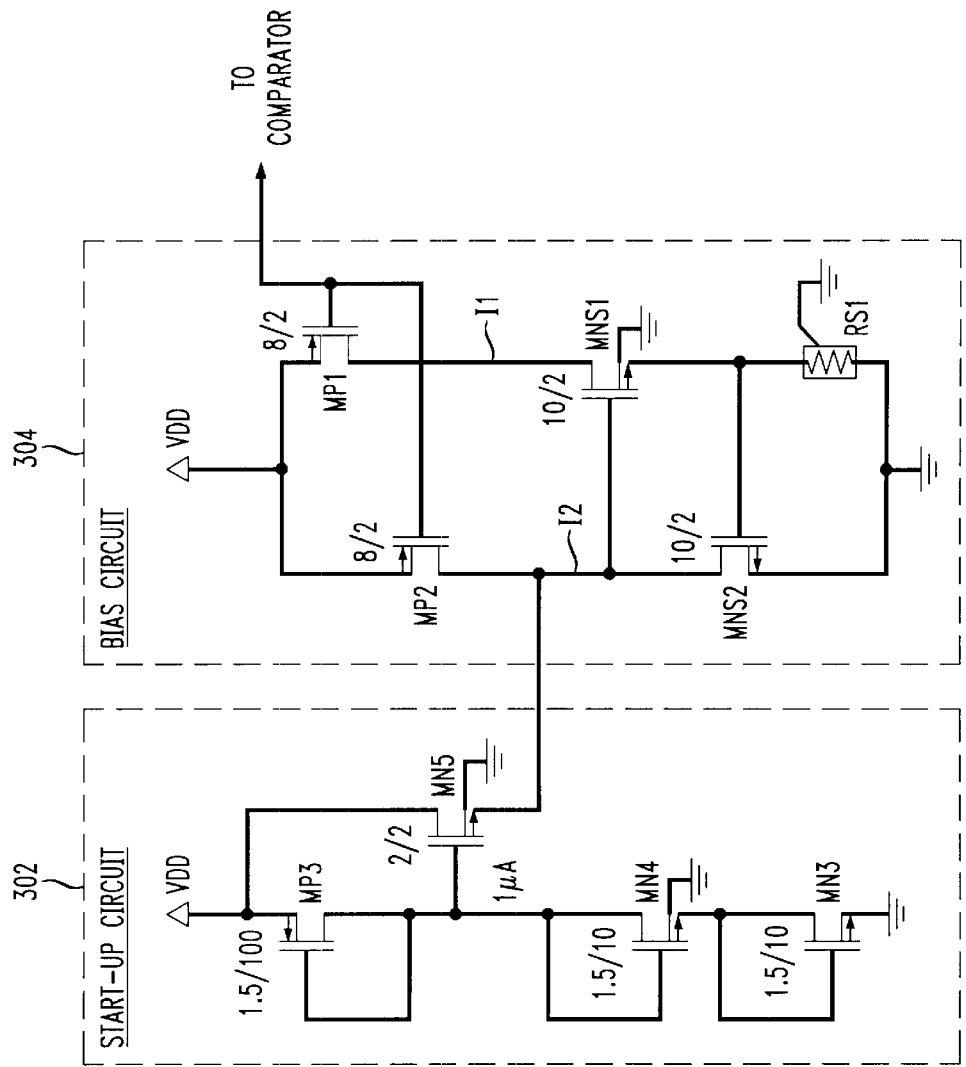
FIG. 4A shows in more detail exemplary start-up circuit and bias circuits of the exemplary clock receiver shown in FIG. 3.
Figure 4B:
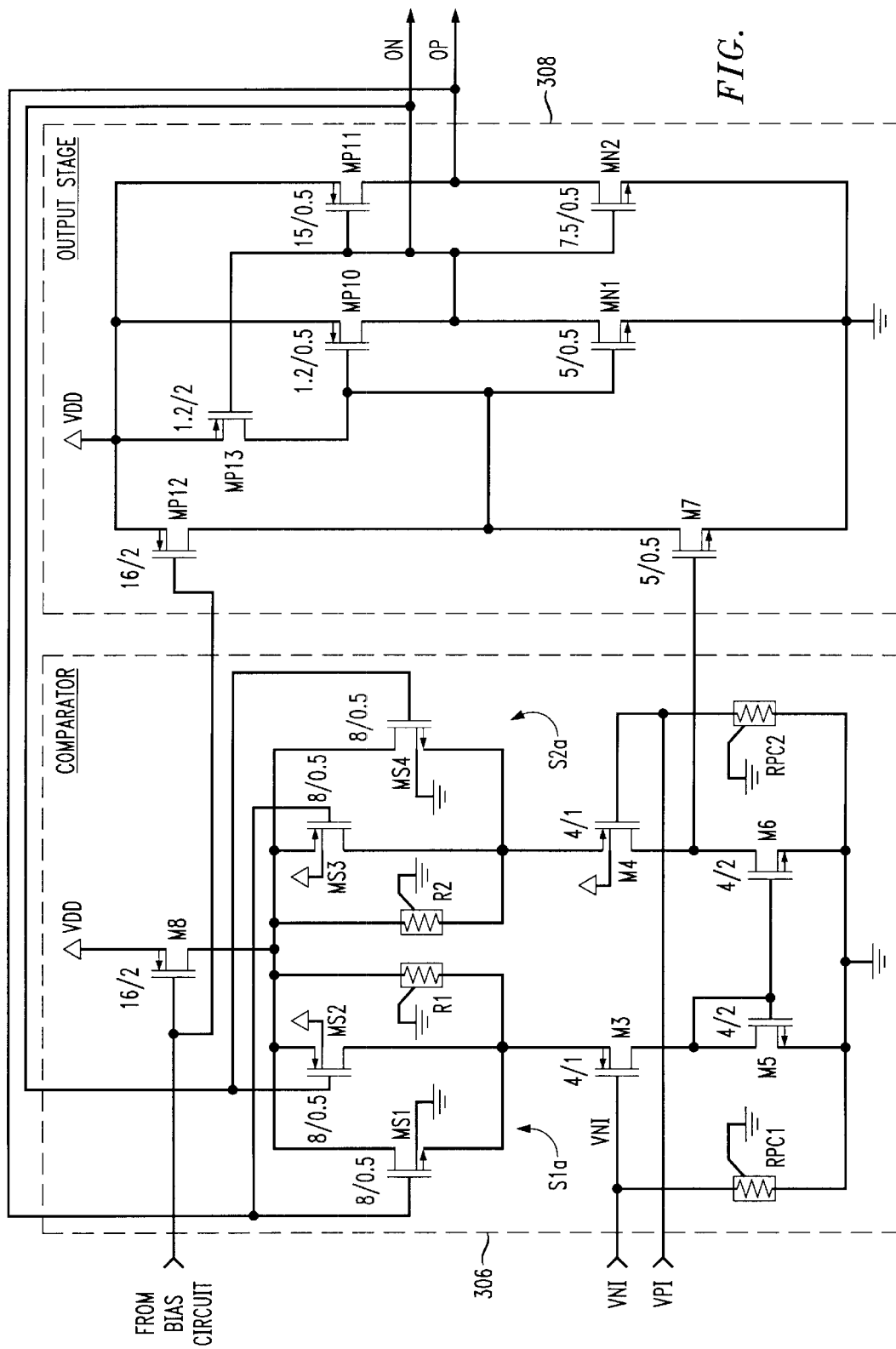
FIG. 4B shows in more detail exemplary low power comparator and output stages of the exemplary clock receiver shown in FIG. 3.

An exemplary embodiment of the start-up circuit 302 and the bias circuit 304 is shown in detail in FIG. 4A, while an exemplary embodiment of the comparator 306 and the differential output stage 308 is shown in detail in FIG. 4B. A suitable bias and bias start-up circuit is shown in P. R. Gray and R. G. Meyer, *Analysis and Design of Analog Integrated Circuits*, John Wiley & Sons, Inc., (1993), pp. 322–333, the entirety of which is expressly incorporated herein by reference.

In particular, FIG. 4A shows the bias circuit 304 and its start-up circuit 302.

The exemplary start-up circuit 302 shown in FIG. 4A includes transistors MP3, MN5, MN4 and MN3. Preferably, the current flow through transistor MP3 is about 1 microamps ($\mu$A) maximum.

The bias circuit 304 is a regulated current source. The bias circuit 304 is comprised of transistors MP2, MP1, MNS1, MNS2 and a resistor RS1. The current source produced by MP2 (I2 shown in FIG. 4A) and MP1 (I1 shown in FIG. 4A)(diode connected) forces the same current to flow in transistors MNS2 and MNS1 (I1=I2=I).

The current flow I is determined by the following expression:

$$I \times RS1 = V_{TH} + \sqrt{\frac{2I}{\mu \left( Cox \left( \frac{W}{L} \right) \right)_{MNS2}}}$$

where $V_{TH}$ is the threshold voltage of transistor MNS2.

If I is small and (W/L) of transistors MNS1 and MNS2 is large, then I≈$V_{TH}$/RS1.

Because of the feedback of transistors MNS1 and MNS2, the current flow through resistor RS1 is almost independent from any changes in the voltage of the power supply (e.g., 2 V to 5.5 V).

It should be noted that because the point I=0 is stable, this circuit preferably includes the start-up circuit 302. However, the principles of the present invention relate to a circuit including a low power differential comparator circuit without a start-up circuit 302.

FIG. 4B shows in more detail an exemplary low power comparator 306 and an exemplary differential output stage 308 of the clock receiver embodiment including a low power comparator circuit, e.g., as shown in FIG. 3.

The total supply current of the low power comparator 306 shown in FIG. 4B in an exemplary embodiment is less than 50 $\mu$A. This is many times less than a comparable value of 355 $\mu$A as in a conventional differential comparator circuit, e.g., as shown in FIG. 1.

The low power comparator 306 uses the current through the input devices to also set the hysteresis levels by adding resistors R1, R2 to the sources of the input transistors M3, M4, respectively, with output state controlled switches S1a, S2a across them. In this embodiment, the first switch S1a in a negative input stage is formed by transistors MS1 and MS2, while the second switch S2a in a positive input stage is formed by transistors MS4 and MS3.

In operation, when the positive output signal OP is at a low level, the CMOS switch comprised of transistors MS1 and MS2 is off, and the CMOS switch comprised of transistors MS3 and MS4 is on. This results in an input referred offset of $V_{OS}(L) = -I_{M3} \times R1$. When the output is high, $V_{OS}(H) = I_{M4} \times R2$.

Bias circuit 304 sets:

$$I_{M8} = 2 \times I_{MP1} = 2 \times \frac{V_{TH}}{RS1}$$

where $V_{TH}$ is the threshold voltage of transistor MNS2 in bias circuit 304 (FIG. 4A). At the comparator switching point, $$I_{M3} = I_{M4} = \frac{I_{M8}}{2} = \frac{V_{TH}}{RS1}$$

Now, writing the comparator input hysteresis level as a function of bias level:

$$V_{OS}(L) = -V_{TH} \times \left(\frac{R1}{RS1}\right)$$

and $$V_{OS}(H) = V_{TH} \times \left(\frac{R2}{RS1}\right)$$

The hysteresis level is set by the ratio of the input stage resistors to the bias circuit resistor and the threshold voltage of transistor MNS2 in the bias circuit 304. The hysteresis is a very weak function of supply voltage and process conditions to the extent that the threshold of the transistor MNS2 is stable.

With the exemplary values of

R1=R2=80kΩ

RS1=180kΩ

$V_{TH}$=0.81V the comparator bias and offsets are:

$I_{M8}$=9 µA $$V_{OS}(L) = -0.81 \text{ V} \times \left(\frac{80k}{180k}\right) = -0.36 \text{ V}$$

$$V_{OS}(H) = +0.81 \text{ V} \times \left(\frac{80k}{180k}\right) = +0.36 \text{ V}$$

Thus, in accordance with the present invention as embodied in FIGS. 2, 3, 4A and 4B, better immunity from supply voltage, process and temperature variation, and higher reliability are provided with respect to conventional differential comparator circuits, e.g., as shown in FIG. 1.

The present invention has many applicable uses, including but not limited to use in a DAA interface codec.

While the invention has been described with reference to the exemplary embodiments thereof, those skilled in the art will be able to make various modifications to the described embodiments of the invention without departing from the true spirit and scope of the invention.

What is claimed is:

1. A low power differential comparator circuit, comprising:
    a differential comparator;
    a first positive feedback circuit feeding back a signal from a positive output node of said differential comparator to a positive input node to an input stage of said differential comparator, said first positive feedback circuit including a switched current path;
    a second positive feedback circuit feeding back a signal from a negative output node of said differential comparator to a negative input node to said input stage of said differential comparator, said second positive feedback circuit including a switched current path;
    a first AC coupling capacitor connected to said positive input node; and
    a second AC coupling capacitor connected to said negative input node;
    wherein said first switched current path and said second switched current path operate mutually exclusively.

2. The low power differential comparator circuit according to claim 1, wherein:
    said first switched current path is operated based on a voltage level of said negative output node.

3. The low power differential comparator circuit according to claim 2, wherein:
    said second switched current path is operated based on a voltage level of said positive output node.

4. The low power differential comparator circuit according to claim 1, wherein:
    said second switched current path is operated based on a voltage level of said positive output node.

5. The low power differential comparator circuit according to claim 1, further comprising:
    a bias circuit to bias said input stage of said differential comparator.

6. A differential comparator having isolated hysteresis values, comprising:
    a comparator;
    a bias circuit adapted to bias an input stage of said comparator, said bias circuit including at least one feedback transistor and a bias resistor; and
    a differential output stage connected to said comparator; and
    a start-up circuit connected as an input to said bias circuit;
    wherein any change in a current flow through said bias resistor of said bias circuit is substantially compensated by a change in current flow through said at least one feedback transistor in said bias circuit.

* * * * *